(12) United States Patent
Chang

(10) Patent No.: US 11,824,027 B2
(45) Date of Patent: Nov. 21, 2023

(54) SEMICONDUCTOR PACKAGE

(71) Applicant: TAIWAN SEMICONDUCTOR MANUFACTURING COMPANY LTD., Hsinchu (TW)

(72) Inventor: Shih-Cheng Chang, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 146 days.

(21) Appl. No.: 17/092,142

(22) Filed: Nov. 6, 2020

(65) Prior Publication Data

US 2021/0057366 A1  Feb. 25, 2021

Related U.S. Application Data

(63) Continuation of application No. 16/046,739, filed on Jul. 26, 2018, now Pat. No. 10,833,034.

(51) Int. Cl.
*H01L 23/48* (2006.01)
*H01L 23/00* (2006.01)
*H01L 23/522* (2006.01)

(52) U.S. Cl.
CPC .......... *H01L 24/14* (2013.01); *H01L 23/5226* (2013.01); *H01L 24/02* (2013.01); *H01L 24/03* (2013.01); *H01L 24/05* (2013.01); *H01L 24/06* (2013.01); *H01L 24/10* (2013.01); *H01L 24/11* (2013.01); *H01L 24/12* (2013.01); *H01L 24/13* (2013.01); *H01L 24/16* (2013.01);
(Continued)

(58) Field of Classification Search
CPC ......... H01L 24/06; H01L 24/03; H01L 24/16; H01L 24/13; H01L 24/11; H01L 24/05; H01L 2224/13655; H01L 2224/13147; H01L 2224/13018; H01L 2224/13007; H01L 2224/13082; H01L 2224/11462; H01L 2224/11912; H01L 2224/06051; H01L 2224/05555; H01L 2224/0391; H01L 2224/0221; H01L 2224/02145; H01L 2224/0401; H01L 2224/16227; H01L 2924/3511; H01L 24/12; H01L 23/5226; H01L 24/81; H01L 24/02; H01L 24/10; H01L 24/73; H01L 24/14; H01L 24/32

See application file for complete search history.

(56) References Cited

U.S. PATENT DOCUMENTS 6,107,685 A * 8/2000 Nishiyama .............. H01L 24/16
257/737
6,818,545 B2 * 11/2004 Lee .......................... H01L 24/11
257/E21.705

(Continued)

*Primary Examiner* — Shouxiang Hu
(74) *Attorney, Agent, or Firm* — WPAT Law; Anthony King

(57) ABSTRACT

The present disclosure provides a semiconductor package including a semiconductor chip and a package substrate. The semiconductor chip includes a substrate, a plurality of conductive pads in the substrate, and a plurality of conductive bumps. Each of the conductive bumps is over corresponding conductive pad. At least one of the conductive bumps proximity to an edge of the semiconductor chip is in contact with at least two discrete regions of the corresponding conductive pad. The package substrate has a concave surface facing the semiconductor chip and joining the semiconductor chip through the plurality of conductive bumps.

18 Claims, 21 Drawing Sheets

(52) U.S. Cl.
CPC ............ *H01L 24/73* (2013.01); *H01L 24/81* (2013.01); *H01L 2224/0221* (2013.01); *H01L 2224/02145* (2013.01); *H01L 2224/0391* (2013.01); *H01L 2224/0401* (2013.01); *H01L 2224/05555* (2013.01); *H01L 2224/06051* (2013.01); *H01L 2224/11462* (2013.01); *H01L 2224/11912* (2013.01); *H01L 2224/13007* (2013.01); *H01L 2224/13018* (2013.01); *H01L 2224/13082* (2013.01); *H01L 2224/13147* (2013.01); *H01L 2224/13655* (2013.01); *H01L 2224/16227* (2013.01); *H01L 2924/3511* (2013.01)

(56) References Cited

U.S. PATENT DOCUMENTS

| | | | | |
|---|---|---|---|---|
| 8,604,614 | B2* | 12/2013 | Kwon | H01L 25/50 |
| | | | | 257/737 |
| 8,723,325 | B2* | 5/2014 | Chen | H01L 24/03 |
| | | | | 438/614 |
| 9,679,861 | B1* | 6/2017 | Hool | H01L 23/49816 |
| 2008/0286962 | A1* | 11/2008 | Lee | H01L 24/05 |
| | | | | 438/631 |
| 2009/0283903 | A1* | 11/2009 | Park | H01L 24/03 |
| | | | | 257/737 |
| 2017/0141056 | A1* | 5/2017 | Huang | H01L 24/19 |

* cited by examiner

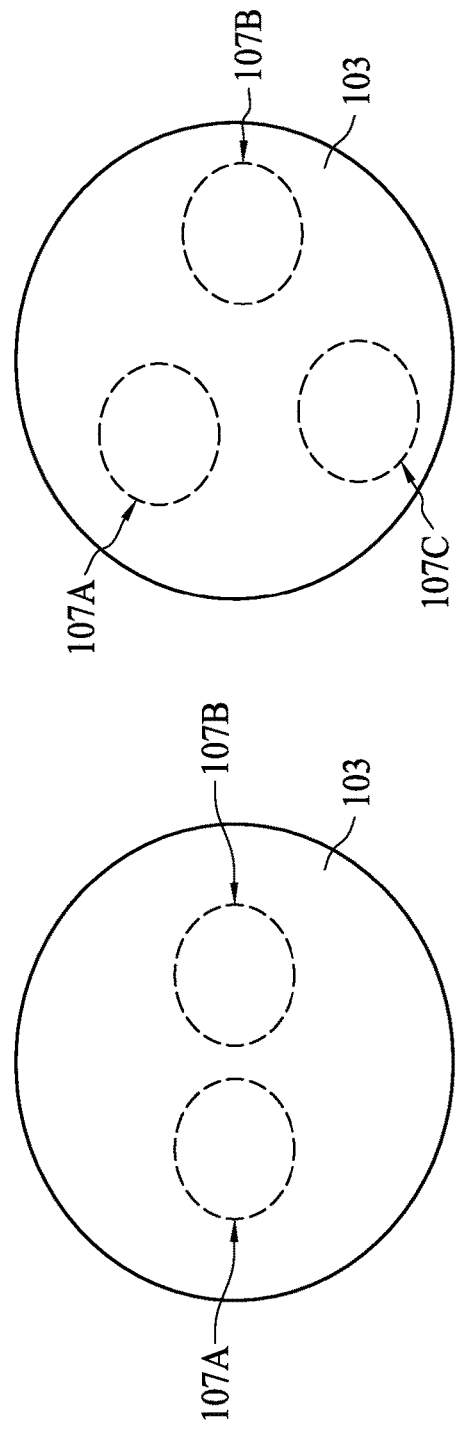
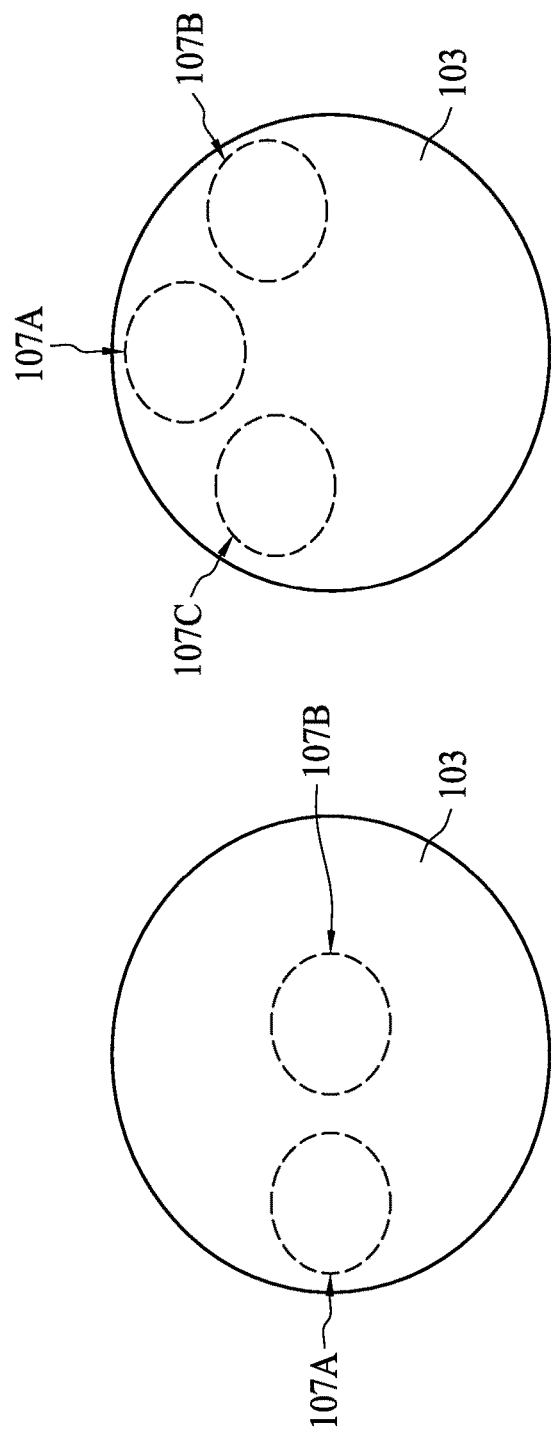
FIG. 3A  FIG. 3B  FIG. 3C  FIG. 3D

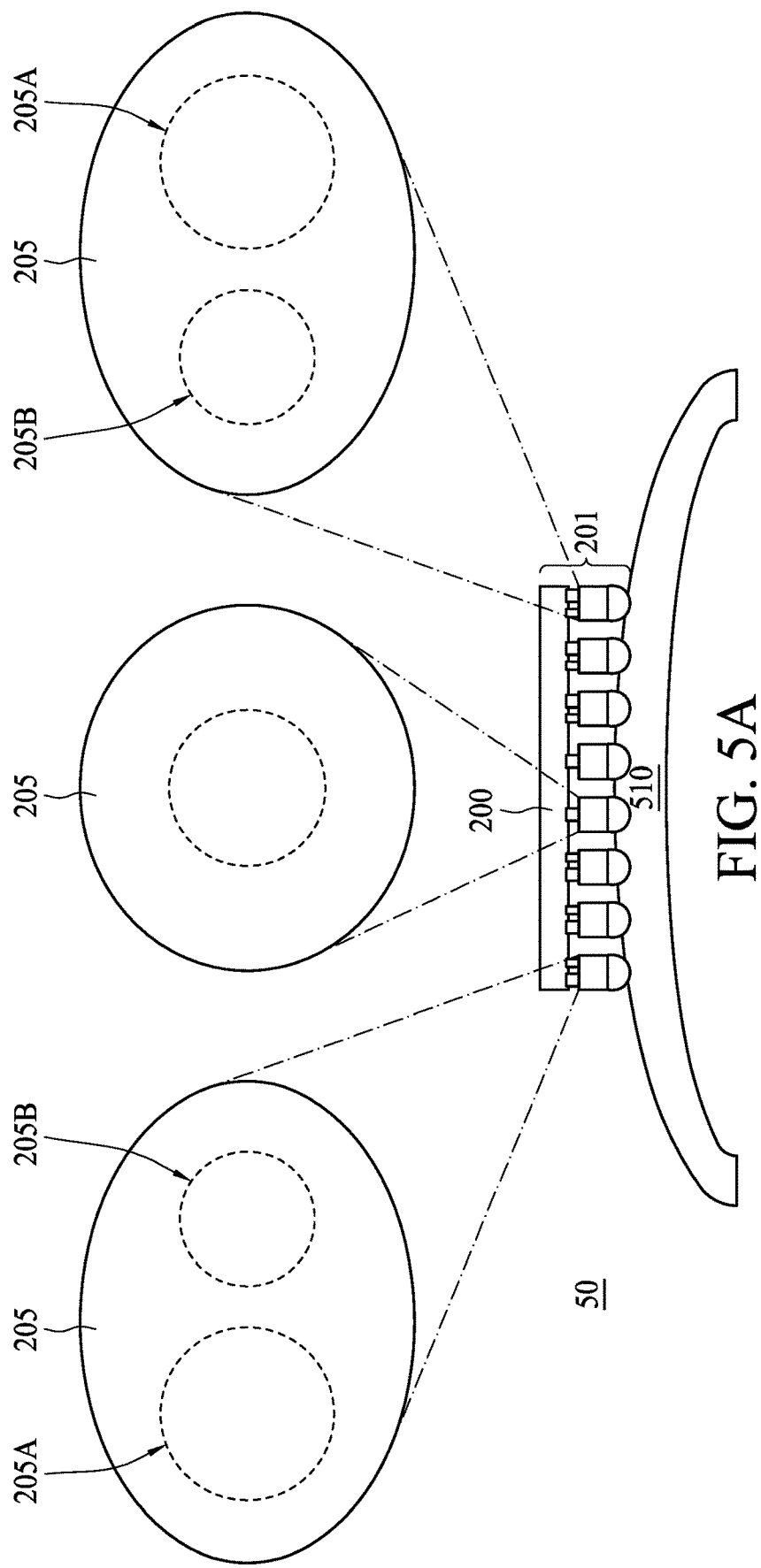

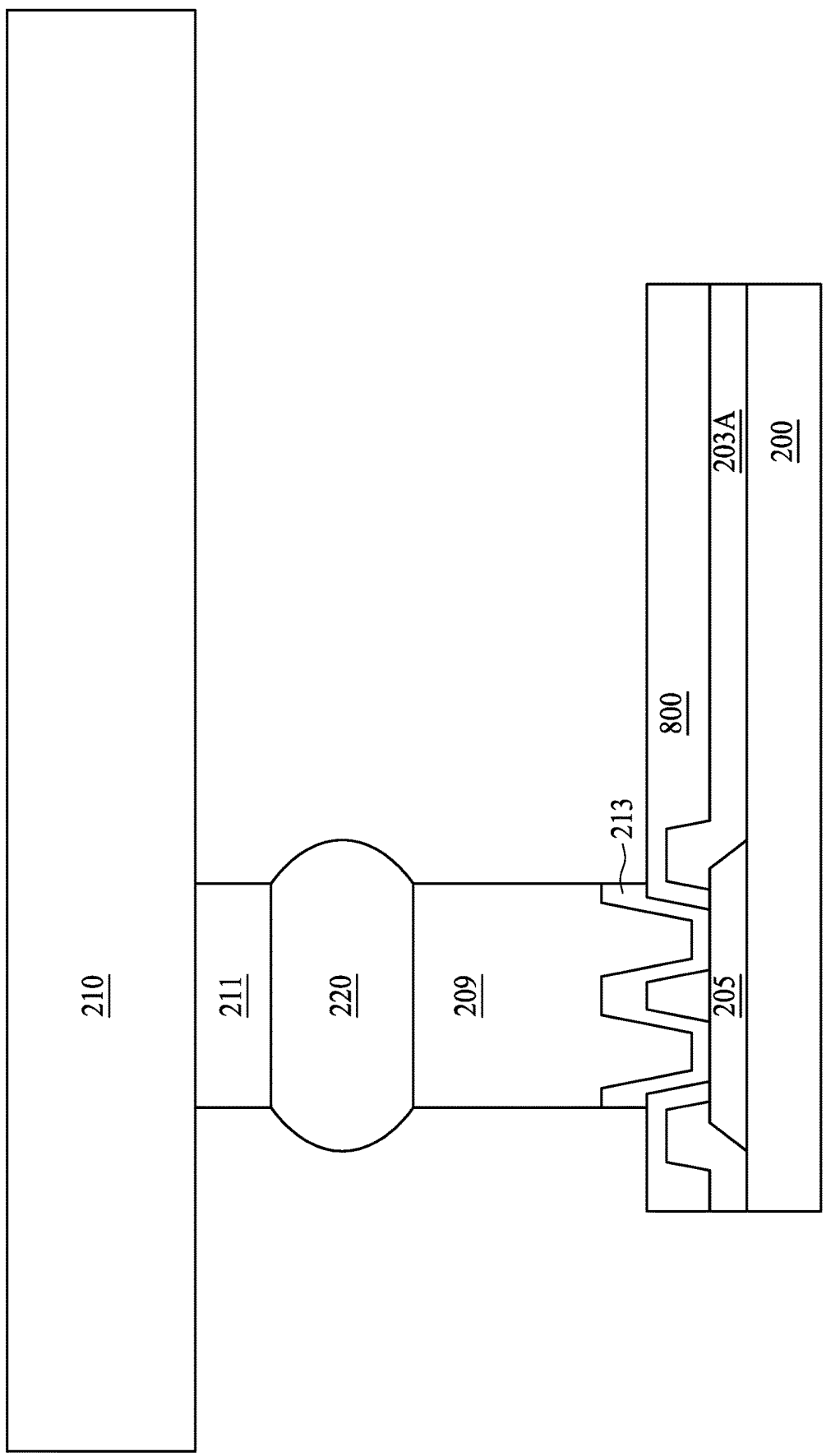

SEMICONDUCTOR PACKAGE

PRIORITY CLAIM AND CROSS REFERENCE

This continuation application claims the benefit of prior-filed application Ser. No. 16/046,739, filed on Jul. 26, 2018.

BACKGROUND

Modern integrated circuits are made of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (LBM) layer located between the bump and an I/O pad. Recently, copper pillar bump technology has emerged. Instead of using solder bump, an electronic component is connected to a substrate by means of copper pillar bumps, which achieve finer pitches with minimum probability of bump bridging, reduces the capacitance load for the circuits, and allows the electronic component to perform at higher frequencies. It is within this context the following disclosure arises.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3D are top views of a conductive pad and the at least two discrete regions of the conductive pad free from coverage of a dielectric layer in accordance with some embodiments of the present disclosure.

FIG. 5A is a cross section showing a semiconductor package joining to a convex-warped package substrate, in accordance with some embodiments of the present disclosure.

FIG. 7 to FIG. 17 are cross sections of a semiconductor package manufactured at various stages, in accordance with some embodiments of the present disclosure.

DETAILED DESCRIPTION

Figure 1A:
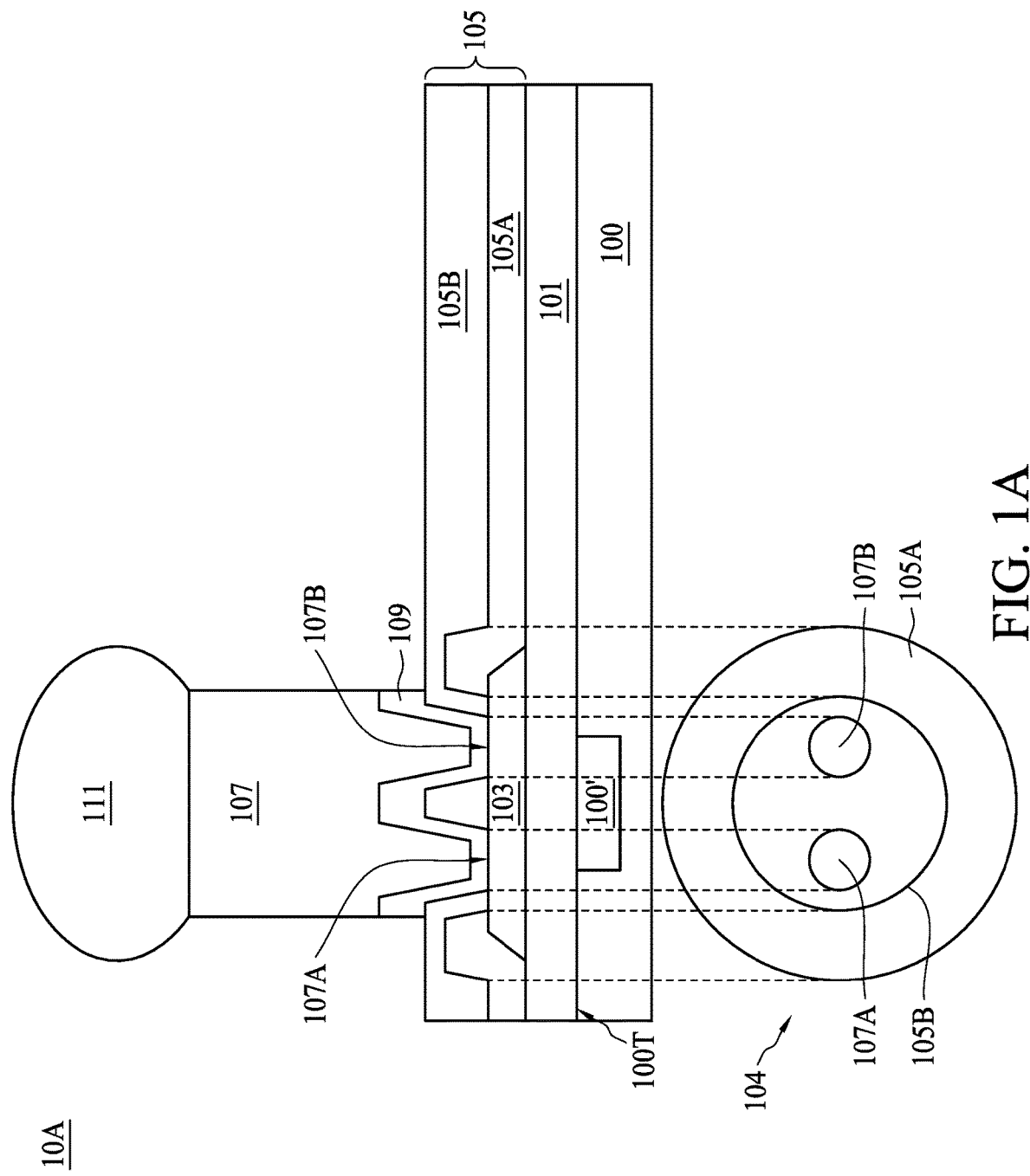
FIG. 1A is a cross section of a semiconductor package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Copper pillar bump, in convention, can be disposed over a conductive bump electrically coupling to a conductive layer. For example, a conductive layer may function as power lines, and re-distribution lines (RDL). Further, the conductive layer may also function as inductors, capacitors or any passive components. Conductive layer may have a thickness less than about 30 μm, for example between about 2 μm and about 25 μm. Conductive layer may connect the metal interconnects underneath to the bump features that receiving the copper pillar bump. A dielectric layer, also referred to as an isolation layer or a passivation layer, is formed on the conductive bump, exposing a discrete region of a surface of the conductive bump. The dielectric layer may be formed of dielectric materials such as silicon nitride, silicon carbide, silicon oxynitride or other applicable materials. The copper pillar bump is then formed over the exposed discrete region of the conductive bump as well as over a neighboring area of said discrete region covered by the dielectric layer.

After the formation of the copper pillar and the dielectric layer, several operations involving heating-cooling cycles are subject to be performed. Copper and dielectric possess different coefficient of thermal expansions (CTE) which, under the heating-cooling cycles, may alternatively generate tensile and compression stress and lead to dielectric delamination at the interface between the conductive bump and the dielectric. Furthermore, such stress may further affect integrity of the underlying interlayer dielectric at the interconnect level.

The stress produced during the heating-cooling cycles is easily accumulated at the boundary of the exposed discrete region of the conductive bump especially when there is only one such exposed discrete region is formed. Therefore, the present disclosure provides a semiconductor package, including a substrate, an active region in the substrate, an interconnect over the active region, a conductive pad over the interconnect, surrounded by a dielectric layer, and at least two discrete regions of the conductive pad are free from coverage of the dielectric layer. The at least two discrete regions of the conductive pad can be of any suitable numbers and arrangements in consideration of lowering stress concentration as well as counter-balancing stress exerted from a warped package substrate after joining the semiconductor die to the package substrate through the copper pillar on the semiconductor die.

Referring to FIG. 1A, FIG. 1A is a cross section of a semiconductor package 10A, in accordance with some embodiments of the present disclosure. In FIG. 1A, the semiconductor package 10A includes a substrate 100, an active region 100' in the substrate 100, an interconnecting layer 101 over the active region 100', a conductive pad 103 over the interconnecting layer 101 and surrounded by a dielectric layer 105. Discrete regions 107A and 107B of the conductive pad 103 are free from coverage of the dielectric layer 105.

The substrate 100 refers to a construction comprising semiconductor materials, such as a semiconductor wafer, a silicon-on-insulator substrate, or a silicon germanium substrate, but the disclosure is not limited thereto. The substrate 100 has a top surface 100T for receiving the interconnect 101. In some embodiments wherein the substrate 100 joins to a package substrate (such as a package substrate 210 in FIG. 2) through a conductive bump 107, the top surface 100T faces the package substrate with a plurality of conductive bumps connecting between the top surface 100T and the package substrate.

The substrate 100 has the active region 100' formed therein. In some embodiments, the active region 100' is in proximity to the top surface 1001' of the substrate 100. In some embodiments, the active region 100' is coplanar with the top surface 100T of the substrate 100. In some embodiments, the active region 100' refers to a location where microelectronic elements are formed, and suitable microelectronic elements includes, but not limited to, transistors, capacitors, diodes, inductors, and the likes. In some embodiments, the substrate 100 has multiple active regions and isolation regions isolating the multiple active regions from each other. In various examples, the isolation regions include shallow trench isolation (STI) regions or local oxidation of silicon (LOCOS) regions.

The interconnecting layer 101 is formed on the substrate 100 over the active region 100'. In some embodiments, the microelectronic elements in the active region 100' may be interconnected by, or may function with, the interconnecting layer 101 to form integrated circuit devices such as rectifiers, logic devices, or memory devices. In some embodiments, the interconnecting layer 101 includes inter-layer dielectric layers and metallization layers. Inter-layer dielectric layers may include low-k dielectric materials, extra low-k dielectric materials, silicon nitride, silicon oxynitride or other applicable materials. Metallization layers may include copper (Cu), copper alloy or the likes.

The conductive pad 103 is formed on the interconnecting layer 101. In some embodiments, the conductive pad 103 electrically connects the interconnecting layer 101 to provide input/output (I/O) electric contact and/or redistribution. In various examples, the conductive pad 103 includes copper (Cu), aluminum (Al), or alloy thereof.

The dielectric layer 105 is formed on the conductive pad 103 and the interconnecting layer 101. In some embodiments, the dielectric layer 105 is formed on the interconnecting layer 101 at a same level with the conductive pad 103 and surrounds the conductive pad 103. In some embodiments, the dielectric layer 105 and the conductive pad 103 are partly overlapped with the discrete regions 107A and 107B free from coverage of the dielectric layer 105. As shown in a top view of a top surface 104 of the conductive pad 103 in FIG. 1A, the discrete regions 107A and 107B of the top surface 104 are not covered by the dielectric layer 105.

In some embodiments, the dielectric layer 105 includes multiple layers of dielectric materials, such as silicon nitride, silicon carbide, silicon oxynitride or other applicable materials. In some embodiments, the dielectric layer 105 includes a passivation layer 105A and a polymer layer 105B, such as a photo-sensitive polymer layer, stacking over the passivation layer 105A. The passivation layer 105A is at a same level with the conductive pad 103 and covers a peripheral area of the top surface 104 of the conductive pad 103. The passivation layer 105A and the conductive pad 103 are formed on a same surface of the interconnecting layer 101.

As shown in the top view of the top surface 104 in FIG. 1A, the peripheral area of the top surface 104 is covered by the passivation layer 105A. The area other than the peripheral area is partly covered by the polymer layer 105B, for examples, the discrete regions 107A and 107B are not covered by the polymer layer 105B. The discrete regions 107A and 107B are exposed portions of the top surface 104 that are exposed through the dielectric layer 105. From the top view, the discrete regions 107A and 107B are apart from each other. In other words, the edges or boundaries of the discrete regions 107A and 107B have no intersection with each other.

As mentioned above, the conductive bump 107 includes metal materials and the dielectric layer 105 includes dielectric materials. The interface between the conductive bump 107 and the dielectric layer 105 is a heterojunction and inclines to delaminate if the environmental stress on the interface exceeds a threshold value it can bear. The present disclosure provides a semiconductor package, wherein the discrete regions 107A and 107B of the conductive pad 103 can be of any suitable numbers and arrangements in consideration of lowering stress concentration on the interface between the conductive bump 107 and the dielectric layer 105.

The numbers and arrangements of the discrete regions 107A and 107B are merely illustrated as examples for explanation, and can be adjusted or modified for meeting other requirements in accordance with the spirit of the present invention, such as lowering counter-balancing stress exerted from a warped package substrate.

In some embodiments, the semiconductor package 10A further includes the conductive bump 107 over the conductive pad 103 and the dielectric layer 105. The conductive bump 107 contacts portions of the conductive pad 103 exposed through the dielectric layer 105, for examples, the conductive bump 107 contacts the discrete regions 107A and 107B of the conductive pad 103. In some embodiments, the conductive bump 107 includes metal materials such as copper (Cu) or copper (Cu) alloy.

In some embodiments, the semiconductor package 10A further includes an under bump metallurgy (UBM) layer 109 between the conductive bump 107 and the discrete regions 107A and 107B of the conductive pad 103. In some embodiments, the UBM layer 109 contacts sidewalls of the dielectric layer 105 surrounding the discrete regions 107A and 107B and the discrete regions 107A and 107B. In some embodiments, the UBM layer 109 may include multiple layers such as a diffusion barrier layer and a seed layer over the diffusion barrier layer. In some embodiments, the diffusion barrier layer may also function as an adhesion layer. In some embodiments, the diffusion barrier layer may be formed of tantalum (Ta), Titanium (Ti), or compounds thereof, such as tantalum nitride. In some embodiments, the seed layer may be formed of copper (Cu), or other metal or metal alloy for further manufacturing the conductive bump 107 on the discrete regions 107A and 107B.

In some embodiments, the semiconductor package 10A further includes a solder bump 111 joining to the conductive bump 107 at an opposite end of the conductive bump 107 contacting the conductive pad 103 or the UBM layer 109. In some embodiments, the conductive bump 107 has one end connects to the conductive pad 103 and one end connects to the solder bump 111 for further joining other element on the substrate 100 through a distribution line composed of the conductive pad 103, the conductive bump 107 and the solder bump 111. In some embodiments, the semiconductor package 10A further includes a package substrate connected to the solder bump 111.

Although only one single conductive pad 103 and its related structure are illustrated in FIG. 1A for simplicity of explanation, there are a plurality of conductive pads formed on the substrate, and there are also a plurality of conductive humps formed on the substrate, as further discussed below with FIG. 2.

Figure 1B:
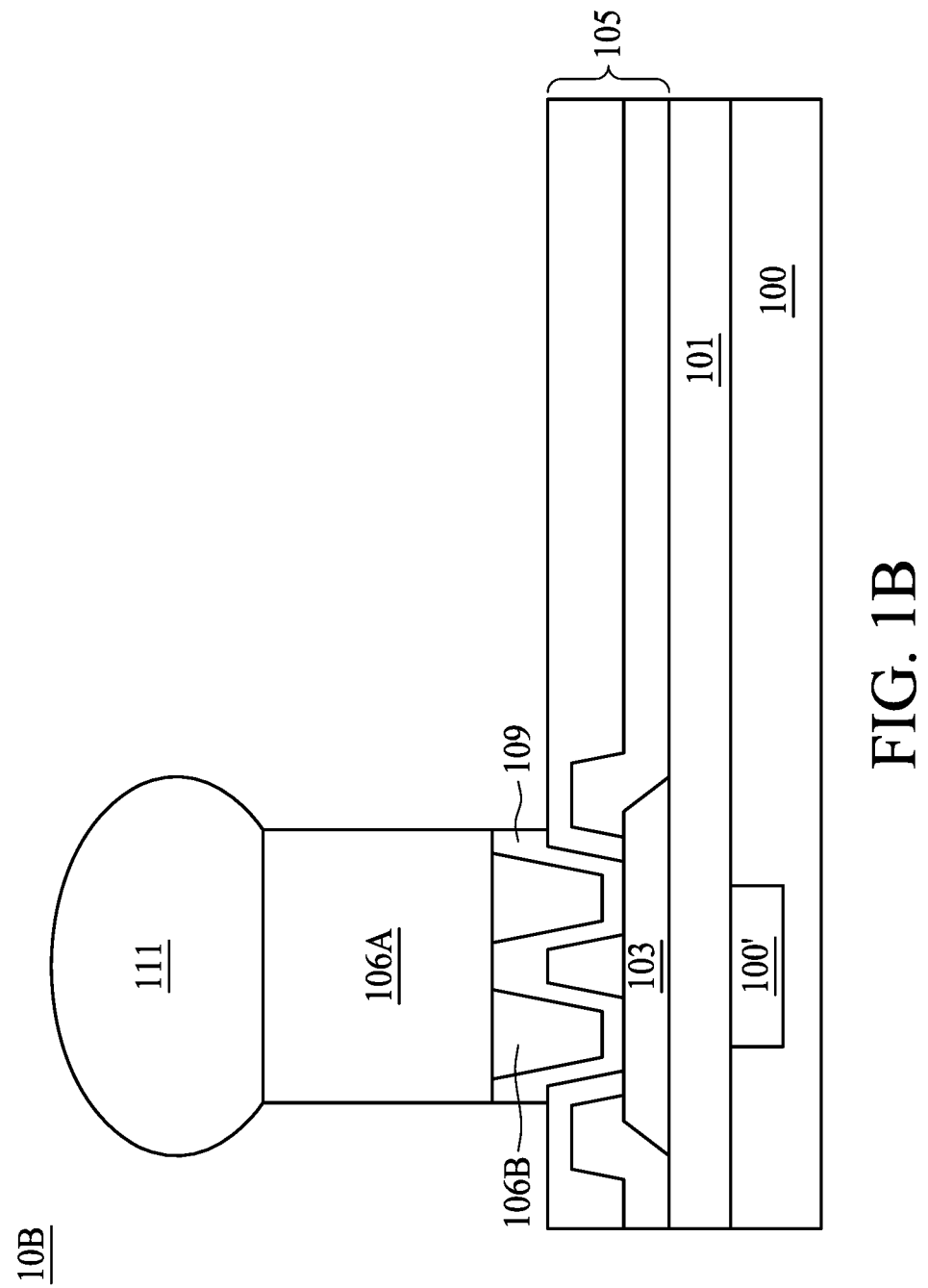
FIG. 1B is a cross section of a semiconductor package, in accordance with some embodiments of the present disclosure.
Figure 1C:
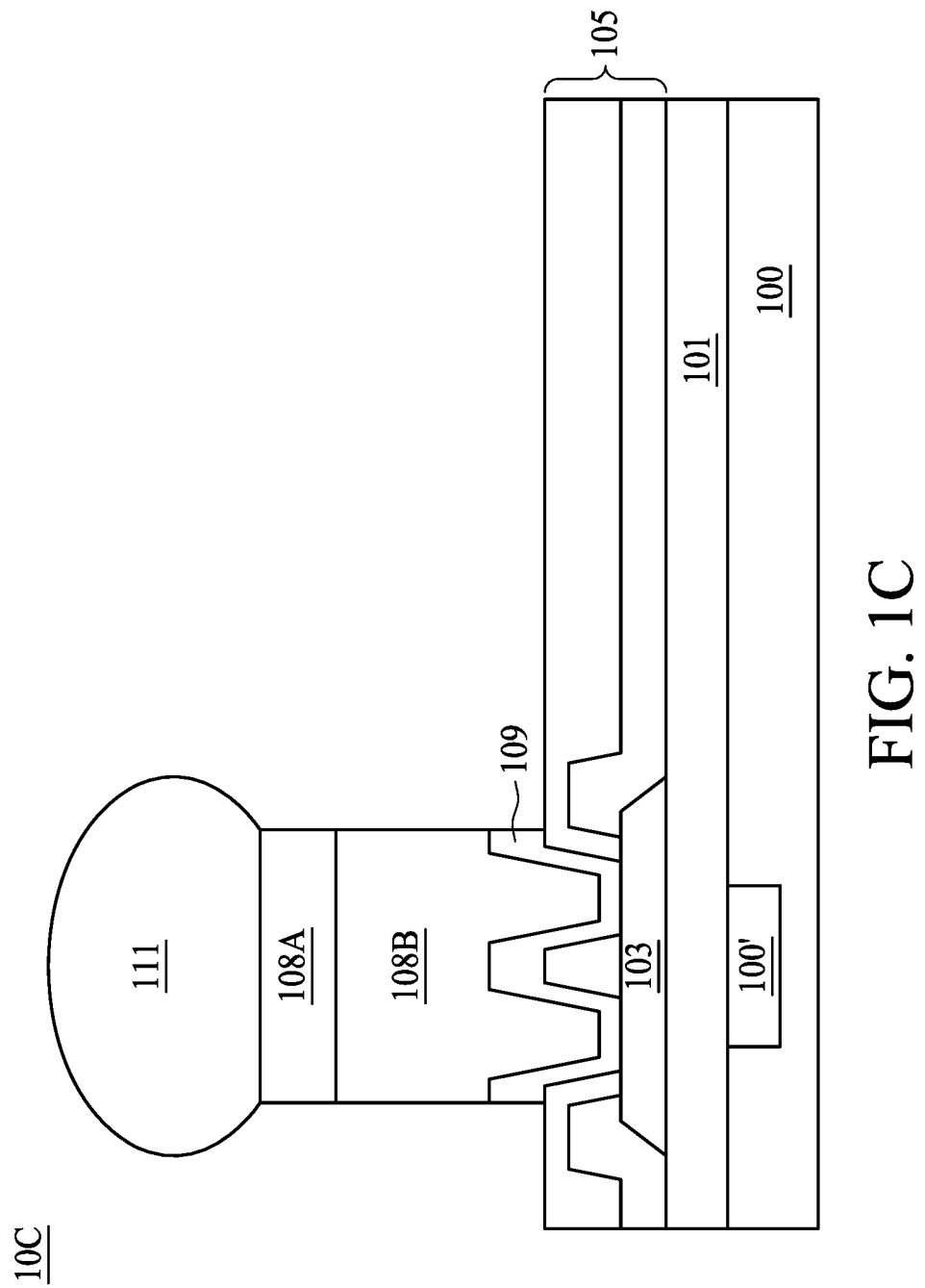
FIG. 1C is a cross section of a semiconductor package, in accordance with some embodiments of the present disclosure.

Referring to FIGS. 1B and 1C, FIGS. 1B and 1C are cross sections of semiconductor packages 10B and 10C, in accordance with some embodiments of the present disclosure. Since the semiconductor packages 10B and 10C in FIGS. 1B and 1C is similar to the semiconductor package 10A described above in relation to FIG. 1A, the identical numbers represent similar components for simplicity of explanation. Such similar components are omitted in the interest of brevity, and only the differences are provided.

In FIGS. 1B and 1C, conductive bumps 106 and 108 includes copper (Cu) and nickel (Ni). The relative amounts of the copper (Cu) and nickel (Ni) in the conductive bumps 106 and 108 can be adjusted. In some embodiments, the amounts of copper (Cu) are less than the amounts of nickel (Ni) as illustrated in FIG. 1B. In some embodiments, the amounts of copper (Cu) are more than the amounts of nickel (Ni) as illustrated in FIG. 1C. In some embodiments, the amounts of copper (Cu) and the amounts of nickel (Ni) are substantially the same. Also, the proportions of the respective composition of the copper (Cu) and nickel (Ni) in the whole conductive hump can be adjusted.

In FIG. 1B, the conductive bump 106 includes a nickel portion 106A contacting the solder bump 111 and a copper portion 106B contacting the UBM layer 109. In some embodiments, the copper portion 106B is coplanar with the UBM layer 109. In FIG. 1C, the conductive bump 108 differs from the conductive bump 106 in that a nickel portion 108A thereof only take up a proportion enough to prevent the copper (Cu) in a copper portion 108B from diffusing into the solder bump 111.

Figure 2:
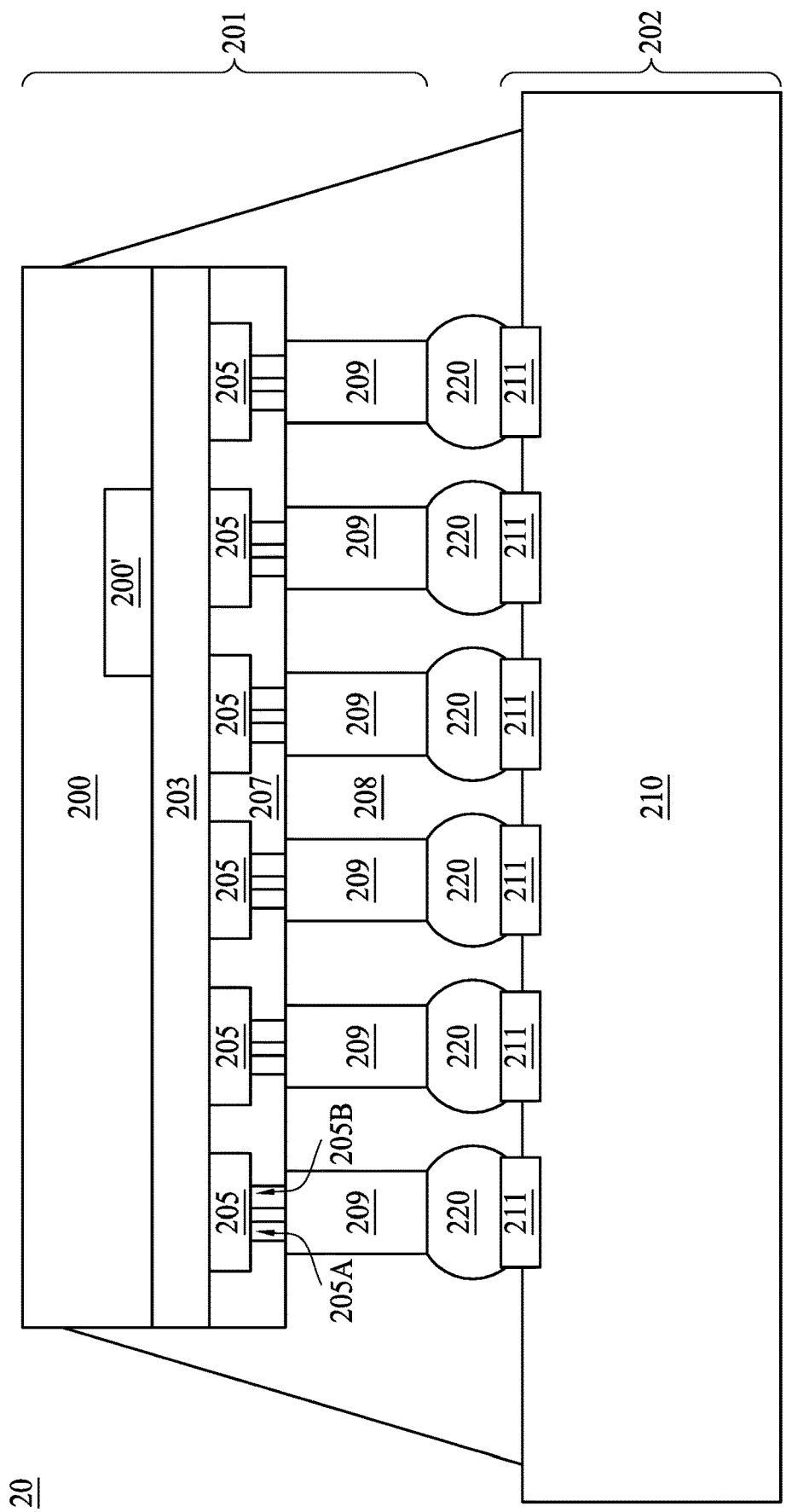
FIG. 2 is a cross section of a semiconductor package, in accordance with some embodiments of the present disclosure.

Referring to FIG. 2, FIG. 2 is a cross section of a semiconductor package 20, in accordance with some embodiments of the present disclosure. In FIG. 2, the semiconductor package 20 includes a semiconductor chip 201 and a carrier 202, such as the package substrate 210 and corresponding contact pads 211 over the package substrate 210. The semiconductor chip 201 is joined to the package substrate 210 through a plurality of conductive bumps 209 and solder bumps 220.

The semiconductor chip 201 includes a substrate 200, an active region 200' in the substrate 200, an interconnecting layer 203 over the active region 200', a plurality of conductive pads 205 formed over the interconnecting layer 203 and surrounded by a dielectric layer 207, and the plurality of conductive bumps 209 over the conductive pads 205 and the dielectric layer 207.

The semiconductor package 20 is similar to the semiconductor package 10A described above in relation to FIG. 1A with the differences that the semiconductor package 20 includes the plurality of conductive pads 205 and the plurality of conductive bumps 209.

Each of the plurality of conductive bumps 209 is positioned over the corresponding one of the plurality of conductive pads 205. In some embodiments, each conductive bump 209 is in contact with two discrete regions 205A and 205B of the corresponding one of the conductive pads 205. In some embodiments, at least one of the conductive bumps 209 is in contact with two discrete regions 205A and 205B of the conductive pads 205.

The numbers and arrangements of the discrete regions 205A and 205B are merely illustrated as examples for explanation, and can be adjusted or modified for meeting other requirements in accordance with the spirit of the present invention.

In some embodiments, each conductive bump 209 includes copper (Cu) and Nickle (Ni) as illustrated in FIGS. 1B and 1C.

In some embodiments, the conductive bump 209 that in contact with two discrete regions 205A and 205B of the conductive pads 205 is positioned proximate to an edge of the semiconductor chip 201. For example, the conductive bumps 209 positioned proximate to the edge of the semiconductor chip 201 are in contact with two discrete regions 205A and 205B of the conductive pads 205. In some embodiments, the conductive bumps 209 positioned proximate to a central portion of the semiconductor chip 201 are also in contact with two discrete regions 205A and 205B of the conductive pads 205.

In some embodiments, the semiconductor package 20 further includes an under bump metallurgy (UBM) layer (such as the UBM layer 109 in FIG. 1A) between each of the plurality of conductive bumps 209 and the two discrete regions 205A and 205B of the corresponding one of the plurality of conductive pads 205.

In some embodiments, the semiconductor package 20 further includes a solder bump 220 between each of the plurality of conductive bumps 209 and the package substrate 210. In some embodiments, each solder bump 220 has one end joining to the conductive bumps 209 and one end joining to the package substrate 210 through a plurality of conductive bumps 211.

In some embodiments, an underfill material 208 is filled among the solder bumps 220 for distributing the stress, thus promoting reliability, wherein the underfill material 208 includes epoxy resin.

Referring to 3A to FIG. 3D, FIG. 3A to FIG. 3D are top views of the conductive pad 103, and the discrete regions 107A and 107B of the conductive pad 103 free from coverage of the dielectric layer in accordance with some embodiments of the present disclosure. In FIG. 3A to FIG. 3D, the boundary of the conductive pad 103 is represented by solid line and the discrete regions 107A and 107B are represented by dash lines. The areas between the solid line and the dash lines are under coverage of the dielectric layer.

In FIG. 3A, the centroid or geometric center of the discrete regions 107A and 107B is substantially overlapped with a central point of the conductive pad 103. As a result, the discrete regions 107A and 107B are positioned such that a center of gravity of the conductive bump 107 is substantially overlapped with the central point of the conductive pad 103.

In FIG. 3B, the centroid or geometric center of the discrete regions 107A and 107B is shift leftward from the central point of the conductive pad 103. In some embodiments, the offset distance can be determined by taking into accounts a stress applied on the interface between the conductive bump and the dielectric layer.

In FIG. 3C, there are three discrete regions 107A, 107B, and 107C free from coverage of the dielectric layer. However, as mentioned above, the numbers and arrangements of the discrete regions are merely illustrated as examples for explanation, and can be adjusted or modified for meeting other requirements in accordance with the spirit of the present invention. In some embodiments, there are more than three discrete regions free from coverage of the dielectric layer.

In FIG. 3D, the centroid or geometric center of the discrete regions 107A, 107B, and 107C is shift upward from the central point of the conductive pad 103.

Figure 4B:
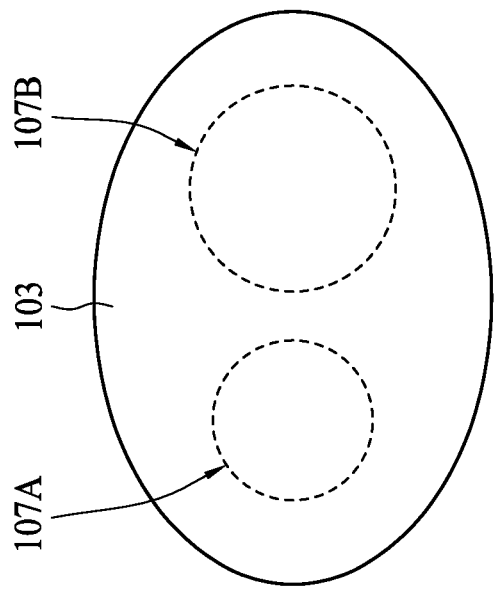
FIG. 4A to FIG. 4B are top views of a conductive pad and the at least two discrete regions of the conductive pad free from coverage of a dielectric layer, in accordance with some embodiments of the present disclosure.
Figure 4A:
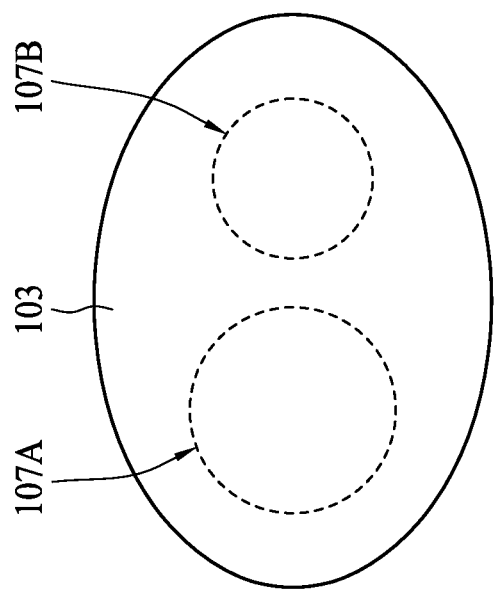

Referring to FIG. 4A to FIG. 4B, FIG. 4A to FIG. 4B are top views of a conductive pad 103, and the discrete regions 107A and 107B of the conductive pad 103 free from coverage of a dielectric layer, in accordance with some embodiments of the present disclosure.

In FIG. 4A to FIG. 4B, the top views of the conductive pad 103 are substantially oval or elliptical. The oval or elliptical shape of the conductive pad 103 may have a major axis extended along a predetermined direction with most prominent stress variations. The oval or elliptical shape of the conductive pad 103 allows discrete regions 107A and 107B to be spaced from each other farther.

In some embodiments, the discrete regions 107A and 107B include different sizes from the top view perspective. For example, in FIG. 4A, the discrete region 107A is bigger than the discrete region 107B. In FIG. 4B, the discrete region 107A is smaller than the discrete region 107B.

Figure 5B:
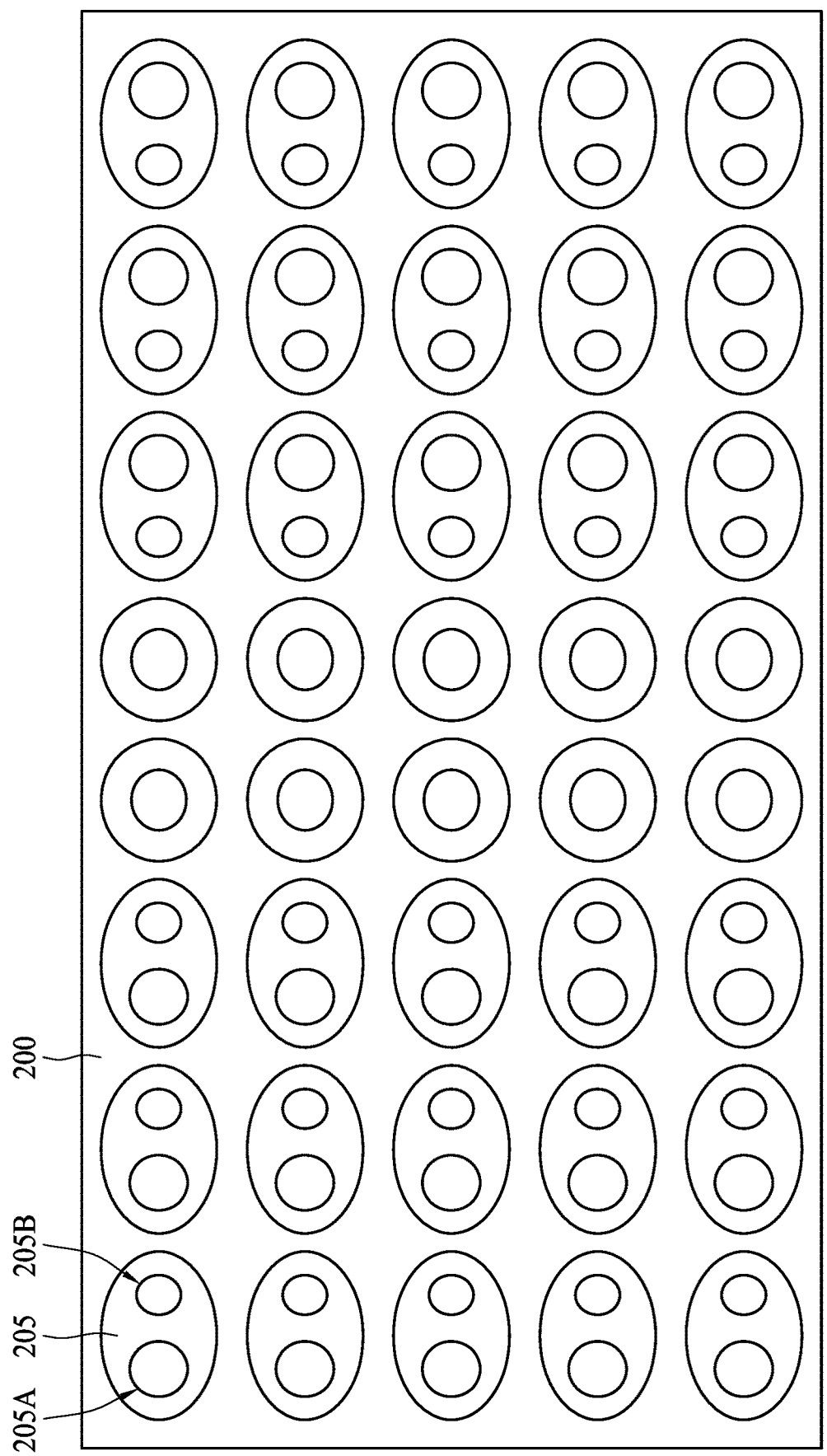
FIG. 5B is a top view of the semiconductor package of FIG. 5A, in accordance with some embodiments of the present disclosure.

Referring to FIGS. 5A and 5B, FIG. 5A is a cross section showing a semiconductor package 50 joining to a convex-warped package substrate 510, and FIG. 5B is a top view of the semiconductor package 50 of FIG. 5A, in accordance with some embodiments of the present disclosure.

In FIGS. 5A and 5B, the semiconductor package 50 includes the substrate chip 201 joining to the convex-warped package substrate 510 through a plurality of conductive bumps and solder bumps. Since the substrate chip 201 is already described above in relation to FIG. 2, similar descriptions are omitted in the interest of brevity, and only the differences are provided.

The convex-warped package substrate 510 contacts the solder bumps with a convex surface, and conductive bumps and the solder bumps positioned proximal to an edge portion of the semiconductor chip 201 have to sustain more tensile stress than the ones positioned proximal to the central portion.

As shown in FIG. 5B and the top views of conductive pads in FIG. 5A, there are two discrete regions in the conductive pads proximal to the edge portion of the semiconductor chip 201. In other words, the conductive bump in contact with the at least two discrete regions of the corresponding conductive pad is positioned proximal to the edge portion of the semiconductor chip 201.

In some embodiments, the conductive pads positioned proximal to the edge of the semiconductor chip 201 have an oval or elliptical shape as illustrated in FIGS. 4A and 4B.

In some embodiments, the discrete region 205B closer to the central portion of the semiconductor chip 201 is smaller the discrete region 205A closer to the edge portion of the semiconductor chip 210.

The shapes and numbers of the conductive pads and the discrete regions can be adjusted in consideration of counter-balancing stress exerted from the convex-warped package substrate 510 joining to the semiconductor chip 201.

Figure 6A:
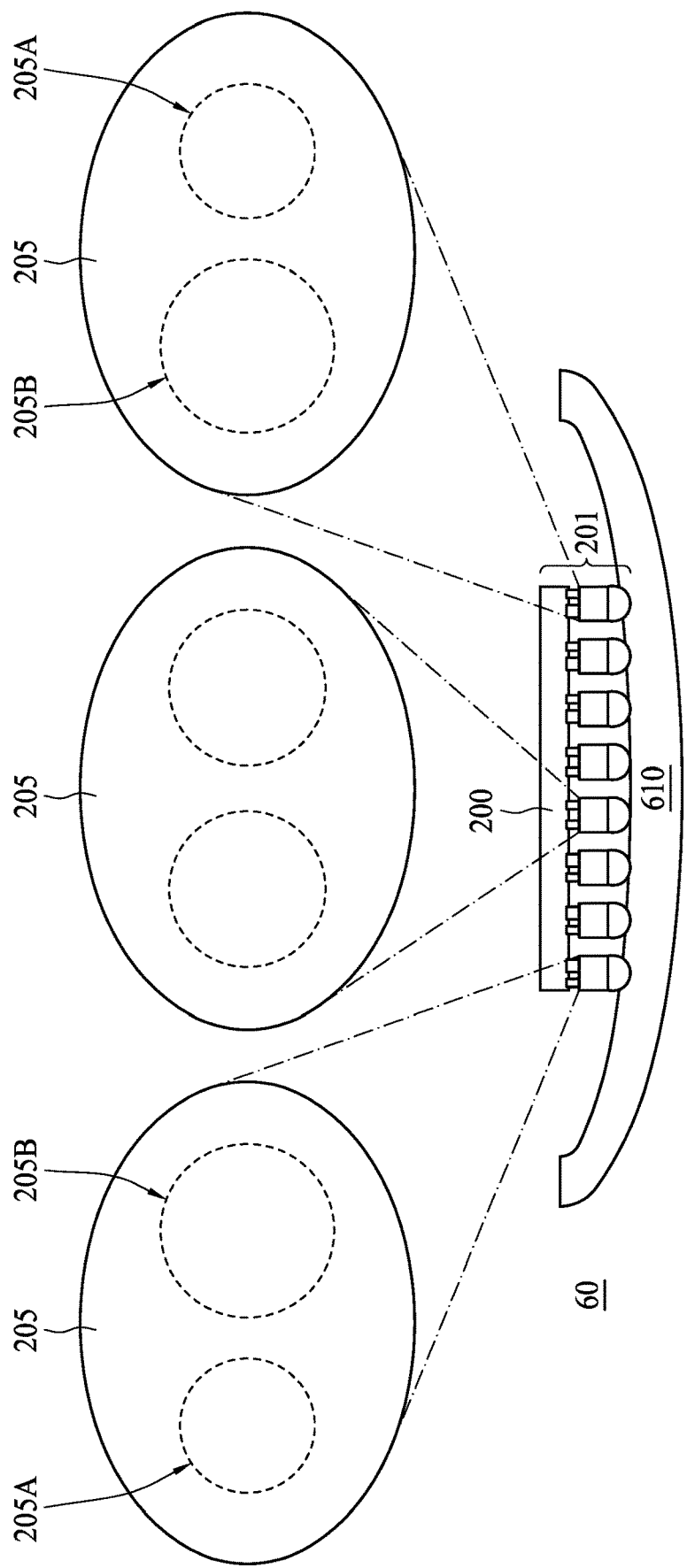
FIG. 6A is a cross section showing a semiconductor package joining to a concave-warped package substrate, in accordance with some embodiments of the present disclosure.
Figure 6B:
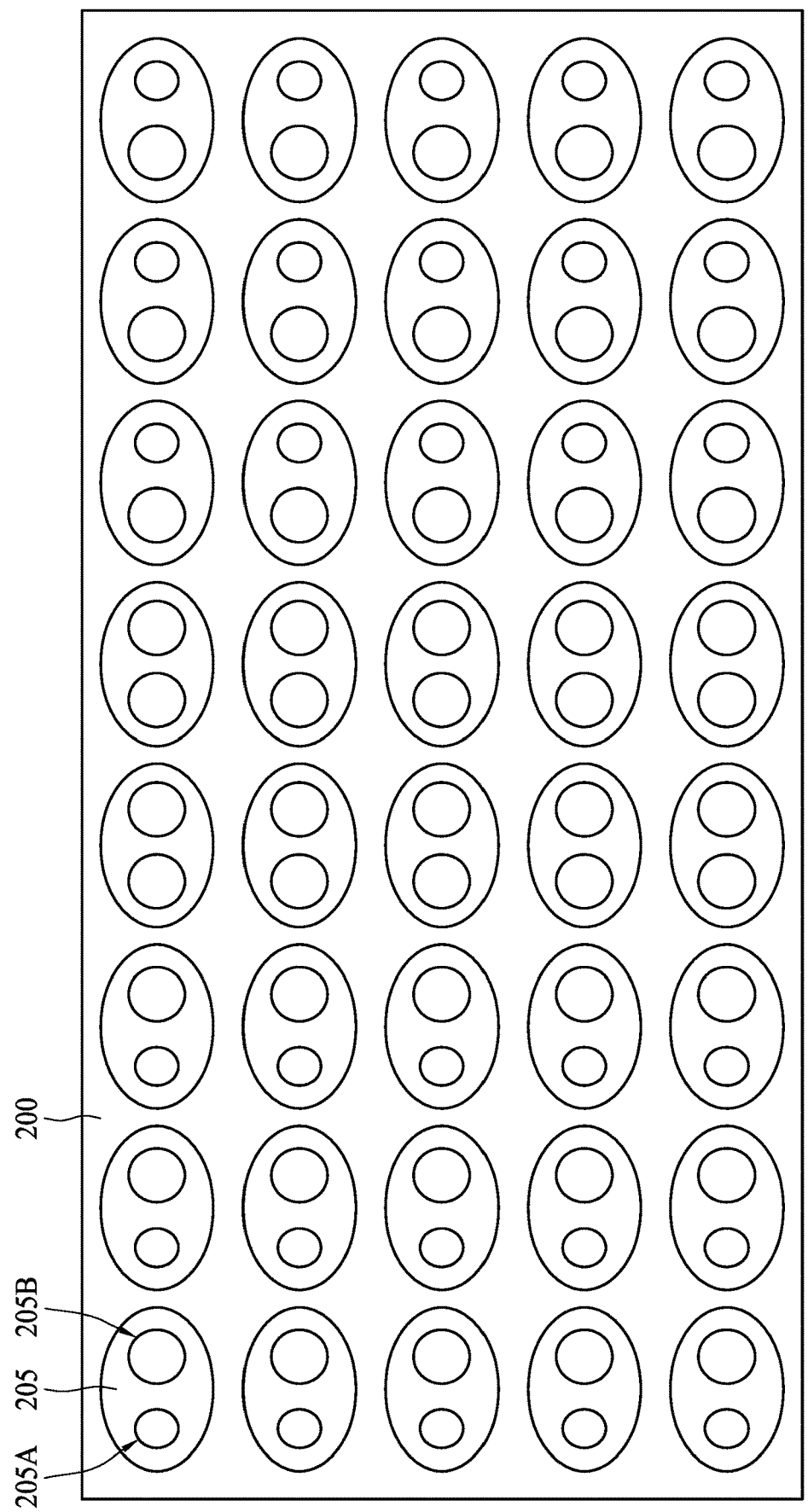
FIG. 6B is a top view of the semiconductor package of FIG. 6A, in accordance with some embodiments of the present disclosure.

Referring to FIGS. 6A and 6B, FIG. 6A is a cross section showing a semiconductor package 60 joining to a concave-warped package substrate 610, and FIG. 6B is a top view of the semiconductor package 60 of 6A, in accordance with some embodiments of the present disclosure.

In FIGS. 6A and 6B, the semiconductor package 60 includes the substrate chip 201 joining to the concave-warped package substrate 610 through a plurality of conductive bumps and solder bumps. Since the substrate chip 201 is already described above in relation to FIG. 2, similar descriptions are omitted in the interest of brevity, and only the differences are provided.

The concave-warped package substrate 610 contacts the solder bumps with a concave surface, and conductive bumps and the solder bumps positioned proximal to the central portion of the semiconductor chip 201 have to sustain more tensile stress than the ones positioned proximal to the edge portion of the semiconductor chip 201.

Since the semiconductor chip 201 in FIGS. 6A and 6B is joined to the concave-warped package substrate 610, the discrete region 205B closer to the central portion of the semiconductor chip 201 is bigger the discrete region 205A closer to the edge portion of the semiconductor chip 210.

Referring to FIG. 7 to FIG. 17, FIG. 7 to FIG. 17 are cross sections of the semiconductor package 20 manufactured at various stages, in accordance with some embodiments of the present disclosure.

Figure 7:
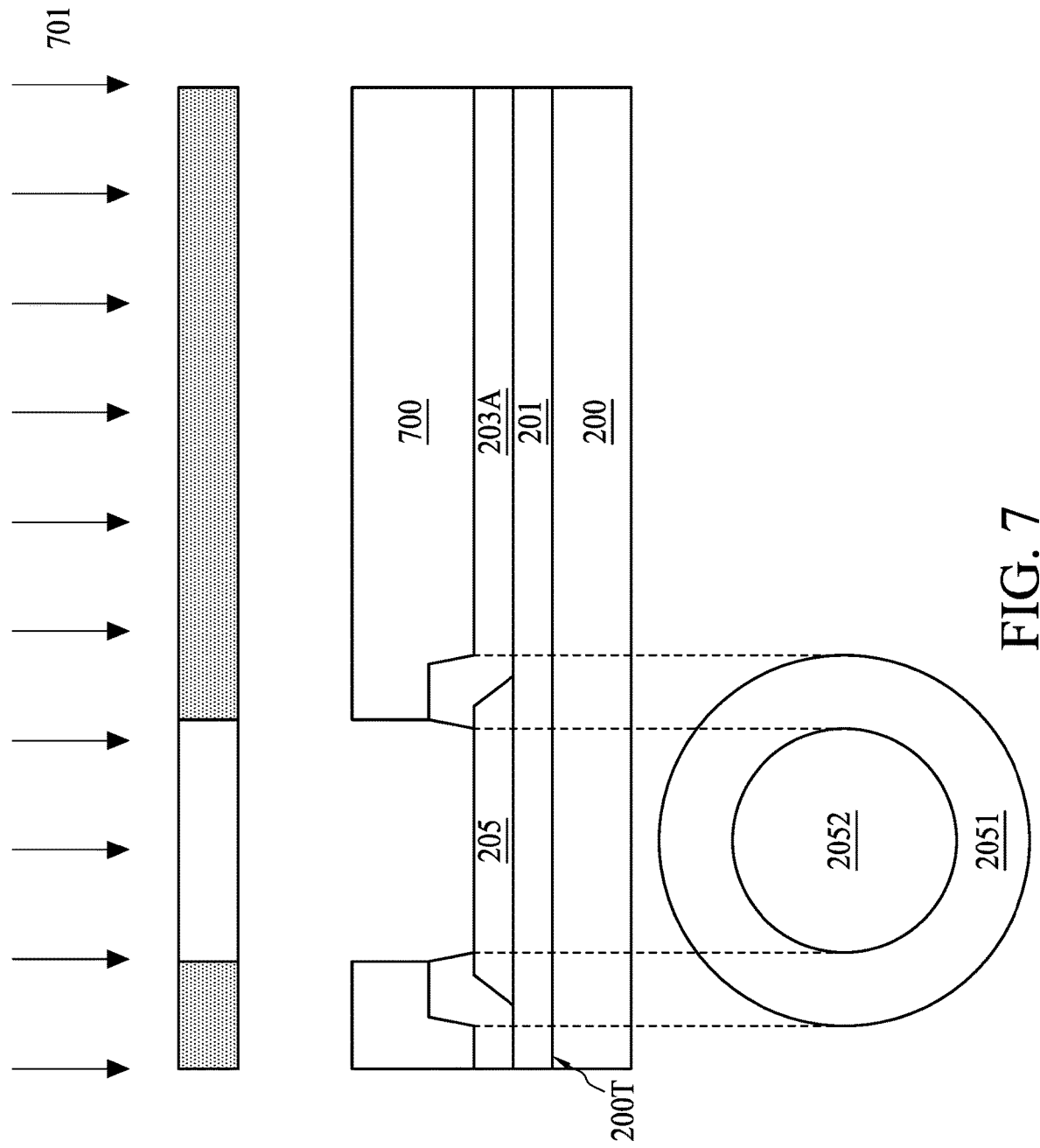

Referring to FIG. 7, the substrate 200 is provided. The substrate 200 has the conductive pad 205 over a top surface 200T thereof. In some embodiments, the conductive pad 205 is formed over an interconnecting layer 201 over an active region (not shown in FIG. 7) in the substrate 200. The conductive pad 205 may be formed by, for examples, sputtering, chemical vapor deposition (CVD) electroless plating, or electrochemical plating.

After the conductive pad 205 is formed, a passivation layer 203A is formed and patterned on the conductive pad 205 and the substrate 200. The passivation layer 203A may be formed of dielectric materials through plasma enhance chemical vapor deposition (PECVD), CVD, or the like. A lithographical process 701 and an etching process are performed to pattern the passivation layer 203A. For example, a photoresist 700 is patterned through the lithographical process 701, and an exposed portion of the passivation layer 203A exposed from an opening in the patterned photoresist 700 is etched away. Then the patterned photoresist 700 is stripped off.

After the exposed portion of the passivation layer 203A is etched away, the conductive pad 205 has a first portion 2051 left covered by the passivation layer 203A and a second portion 2052 exposed from the passivation layer 203A.

Figure 8:
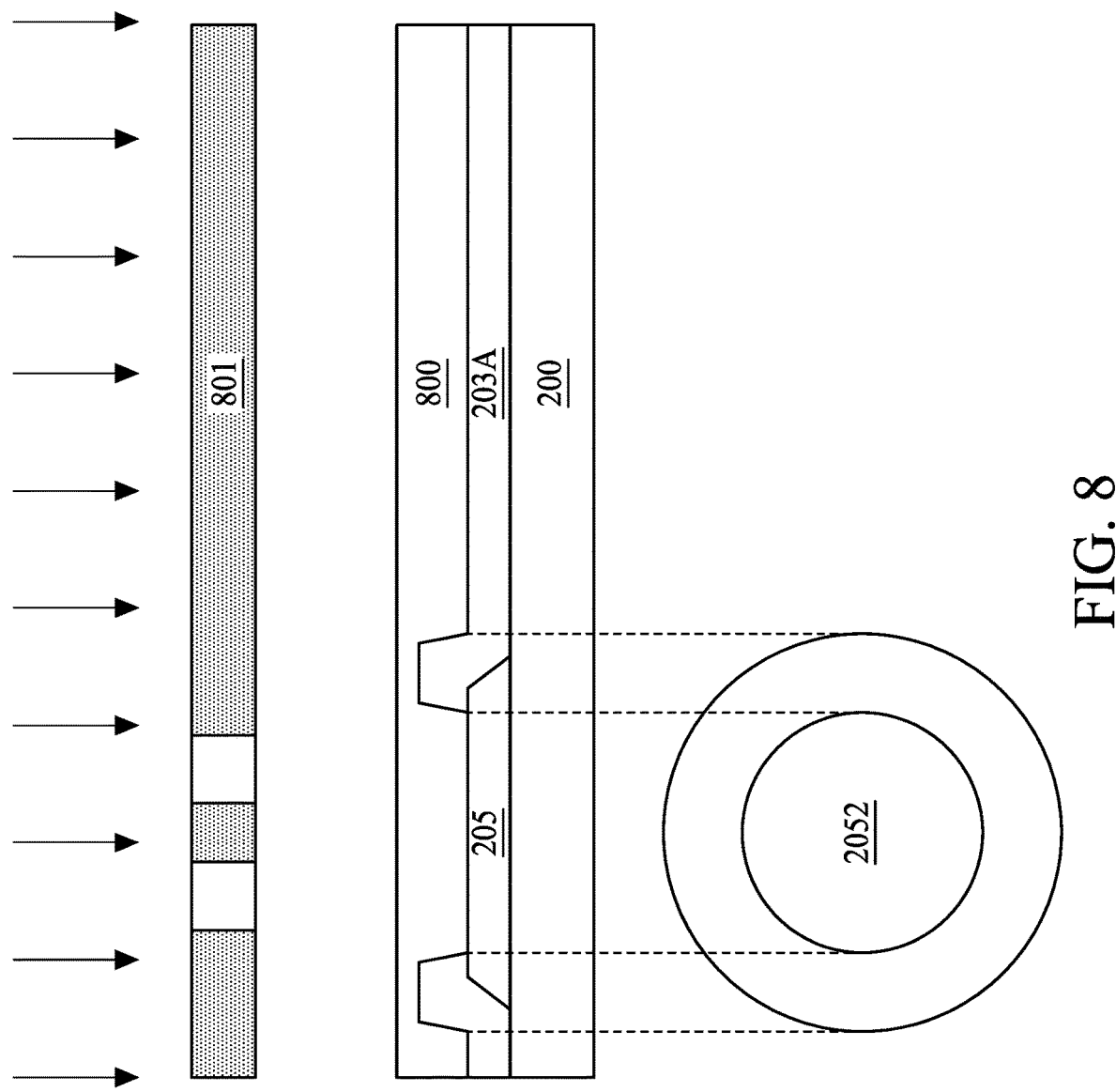

Referring to FIG. 8, a photo-sensitive polymer layer 800 is formed and patterned on the second portion 2052 of the conductive pad 205 and the passivation layer 203A. Another lithographical process and an etching process are performed to pattern the photo-sensitive polymer layer 800. For example, a patterned mask 801 is provided over the photo-sensitive polymer layer 800. The patterned mask 801 has openings corresponding to the discrete regions of the conductive pad 205. In some embodiments, a portion of the photo-sensitive polymer layer 800, upon exposed to the light coming through the openings in the patterned mask 801, undergoes a cross linking process. Then the cross linked portion is etched away. Alternatively, other photo-sensitive polymer having different characteristics and other patterned mask can be used to achieve the desired patterning result over the conductive pad 205.

Figure 9:
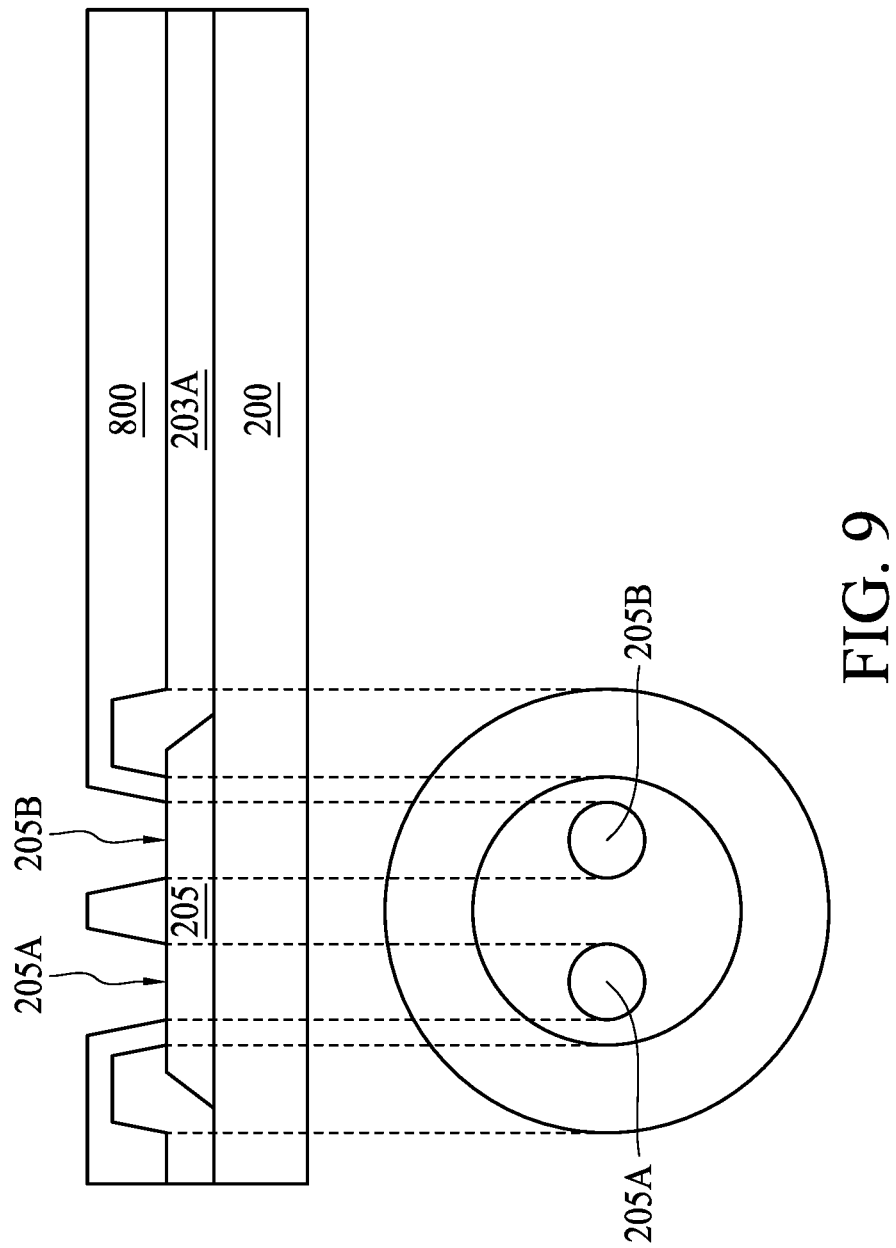

Referring to FIG. 9, after the cross linked portion is etched away, at least two discrete regions 205A and 205B of the conductive pad 205 are exposed from the photo-sensitive polymer 800.

Figure 10:
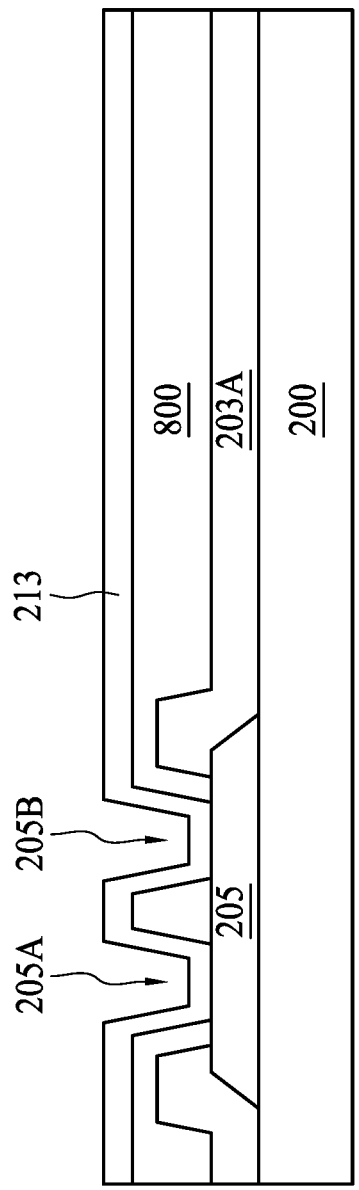

Referring to FIG. 10, a UBM layer 213 is formed over the photo-sensitive polymer layer 800 and over the at least two discrete regions 205A and 205B of the conductive pad 205. The UBM layer 213 may include multiple layers such as a diffusion barrier layer and a seed layer over the diffusion barrier layer. In some embodiments, the UBM layer 213 may be deposited by physical vapor deposition (PVD) or by sputtering.

Figure 11:
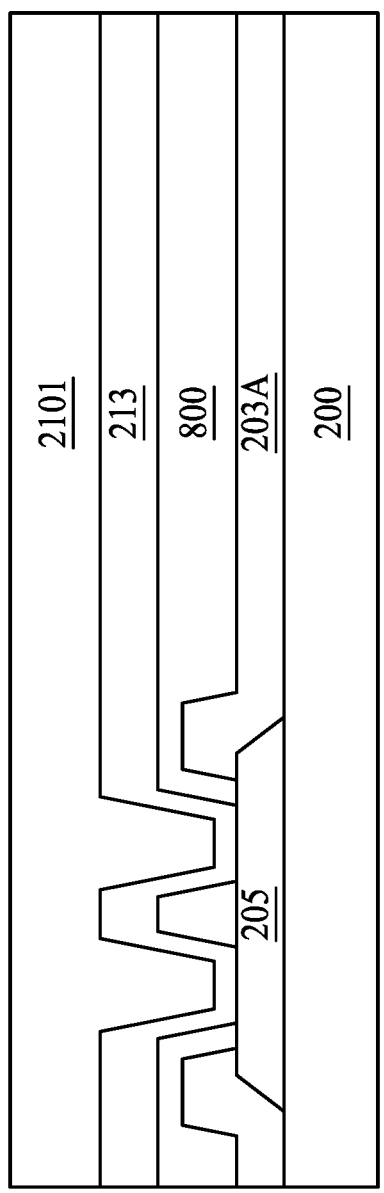

Referring to FIG. 11, a mask layer is provided on the UBM layer 213. For examples, the mask layer includes a photoresist 1201 or a dry film.

Figure 12:
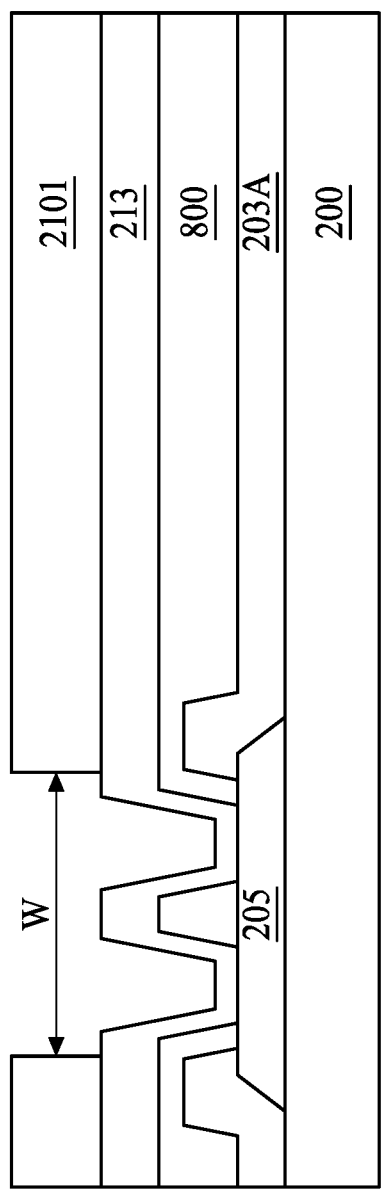

Referring to FIG. 12, the photoresist 1201 is patterned over the UBM layer 213 so as to define a width W of the conductive bump. In some embodiments, the photoresist 1201 is patterned such that the discrete regions 205A and 205B of the conductive pad 205 are exposed. In some embodiments, the photoresist 1201 is patterned such that the discrete regions 205A and 205B of the conductive pad 205 are only covered by the UBM layer 213.

Figure 13:
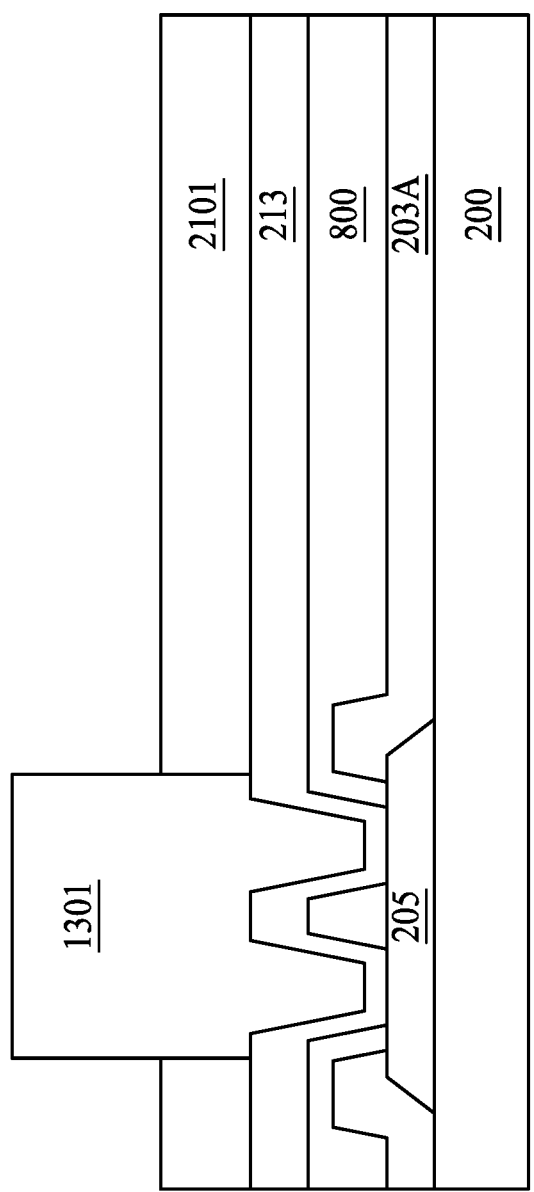

Referring to FIG. 13, a conductive material 1301 is electroplated onto the at least two discrete regions 205A and 205B of the conductive pad 205. In some embodiments, the conductive material 1301 may include copper (Cu). In some embodiments, the conductive material 1301 may include copper (Cu) and nickel (Ni). The conductive material 1301 has solder wettability. The conductive material 1301 contacts to the conductive pad 205 or the UBM layer 213 on the at least two discrete regions 205A and 205B.

Figure 14:
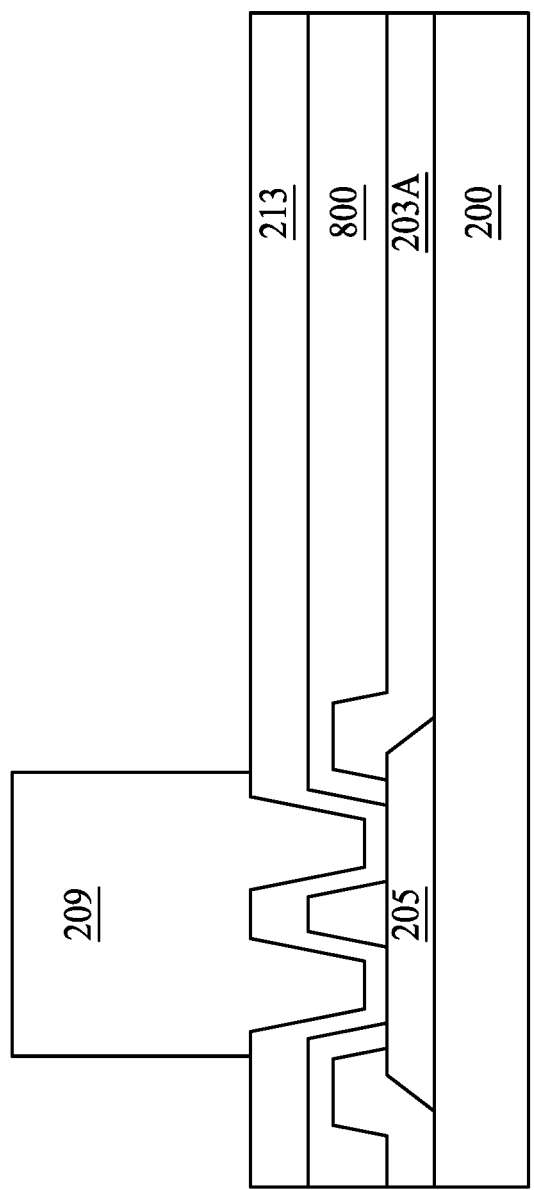

Referring to FIG. 14, after the conductive material 1301 is electroplated, the photoresist 1201 is removed. In some embodiments, the photoresist 1201 is removed using acetone, n-methylpyrrolidone (NMP), dimethyl sulfoxide (DMSO), aminoethoxy ethanol, and the like. The conductive material 1301 is referred as the conductive bump 209 hereafter, and the conductive bump 209 is formed over the at least two discrete regions 205A and 205B of the conductive pad 205.

Figure 15:
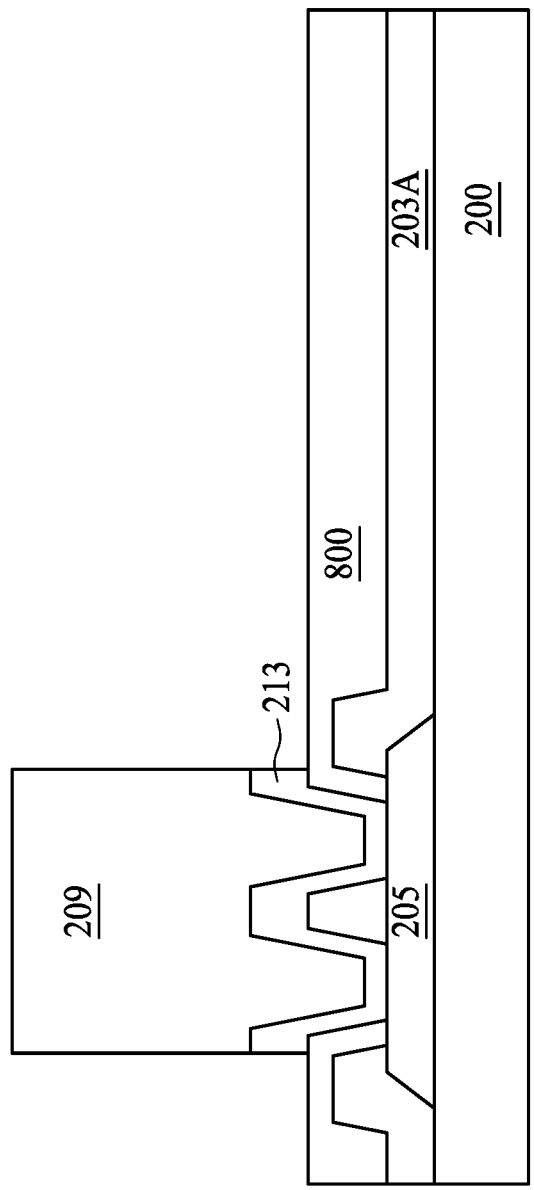

Referring to FIG. 15, the UBM layer 213 not covered by the conductive bump 209 is removed. In some embodiments, the UBM layer 213 may be removed through a dry etching process or a wet etching process. In some embodiments, the UBM layer 213 is removed by an isotropic wet etching using an ammonia-based acid. In some embodiments, the UBM layer 213 may be laterally overetched such that an edge of the conductive bump overhangs the UBM layer 213 (not shown).

Figure 16:
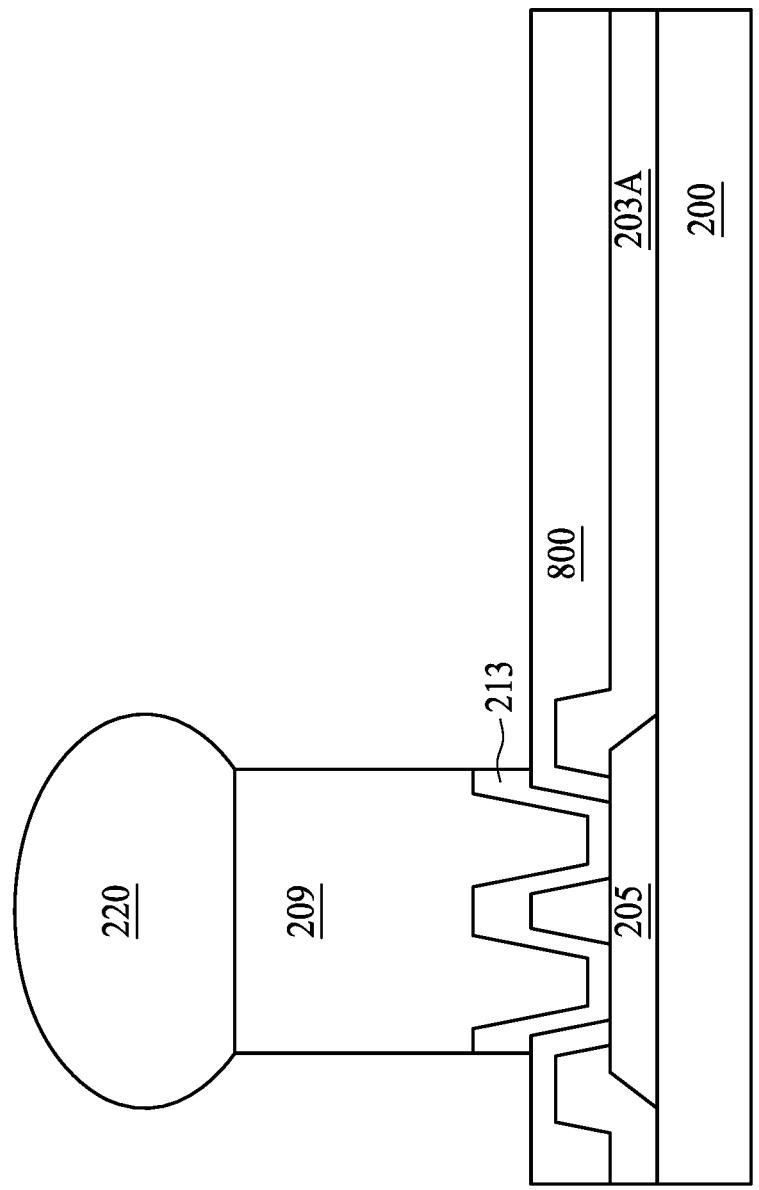

Referring to FIG. 16, the solder ball 220 is placed over an end of the conductive bump 209 opposite to an end contacting the conductive pad 205. Heating-cooling cycles are performed for placing the solder ball 220. The at least two discrete regions 205A and 205B of the conductive pad 205 contributes to lower stress concentration accumulated at the boundary of the exposed discrete regions 205A and 205B.

Referring to FIG. 17, the package substrate 210 is joined to the substrate 200 through the solder ball 220, the conductive pad 211, and the conductive bump 209 corresponding to the conductive pad 211. In some embodiments, the substrate 200 may be joined to a convex-warped package substrate or a concave-warped package substrate. The at least two discrete regions 205A and 205B can be of any suitable numbers and arrangements in consideration of counter-balancing stress exerted from a warped package substrate.

Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

Some embodiments of the present disclosure provide a semiconductor package, including a substrate, an active region in the substrate, an interconnect over the active region, a conductive pad over the interconnect, surrounded by and partially exposed from a dielectric layer. At least two discrete regions of the conductive pad are exposed from the dielectric layer.

Some embodiments of the present disclosure provide a semiconductor package, including a semiconductor chip and a package substrate joining to the semiconductor chip through a plurality of conductive bumps. The semiconductor chip includes a substrate, an active region in the substrate, an interconnect over the active region, a plurality of conductive pad over the interconnect, each surrounded by and partially exposed from a dielectric layer, and a plurality of conductive bumps, each over corresponding conductive pad and the di electric layer, at least one of the conductive bumps being in contact with at least two discrete regions of the corresponding conductive pad.

Some embodiments of the present disclosure provide a method for manufacturing a semiconductor package. The method includes (1) providing a semiconductor substrate having a conductive pad over a top surface of the semiconductor substrate, the conductive pad having a first portion covered by a passivation layer and a second portion exposed from the passivation layer, (2) f forming a photo-sensitive polymer layer over the passivation layer and the second portion of the conductive pad, and (3) patterning the photo-sensitive polymer layer so that at least two discrete regions of the conductive pad are exposed from the photo-sensitive polymer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package, comprising:
 a semiconductor chip, comprising:
  a substrate;
  a plurality of conductive pads in the substrate; and
  a plurality of conductive bumps, each over corresponding conductive pad, at least one of the conductive bumps proximity to an edge of the semiconductor chip being in contact with at least two discrete regions of the corresponding conductive pad; and
 a package substrate having a concave surface facing the semiconductor chip and joining the semiconductor chip through the plurality of conductive bumps.

2. The semiconductor package of claim 1, wherein one of the at least two discrete regions closer to a center of the semiconductor chip is larger than another one of the at least two discrete regions closer to the edge of the semiconductor chip.

3. The semiconductor package of claim 1, wherein the conductive pads having at least two discrete regions are ellipses from top view perspective.

4. The semiconductor package of claim 3, wherein the two discrete regions are on a major axis of each of the conductive pads from top view perspective.

5. The semiconductor package of claim 1, further comprising:
 an active region in the substrate; and
 an interconnecting layer over the active region and in contact with a bottom of each of the conductive pads.

6. The semiconductor package of claim 5, further comprising a dielectric layer over the interconnecting layer, and the conductive pads are laterally surrounded by the dielectric layer.

7. The semiconductor package of claim 6, wherein each of the conductive bumps comprises at least two protrusions and a pillar on the protrusions, wherein the at least two protrusions are separated by the dielectric layer.

8. The semiconductor package of claim 7, wherein the material of each of the protrusions is different to the material of the pillar.

9. A semiconductor package, comprising:
 a substrate;
 an active region in the substrate;
 an interconnecting layer over the active region;
 a conductive pad over the interconnecting layer, surrounded by a dielectric layer; an under bump metallurgy (UBM) layer having at least two circular-shaped recesses over the conductive pad;
 a conductive bump over the UBM layer, the conductive bump comprises at least two protrusions and a pillar on the protrusion;
 a solder ball joining to the conductive bump at an end of the conductive bump; and
 a package substrate having a concave surface or a convex surface contacts the solder ball,
 wherein the protrusions are separated by the dielectric layer, and each of the circular-shaped recesses of the UBM layer is filled with each of the protrusions;
 wherein the material composition of at least a portion of the pillar is different from the material composition of the protrusions.

10. The semiconductor package of claim 9, wherein the UBM layer is in contact with at least two discrete regions of the conductive pad.

11. A semiconductor package, comprising:
 a semiconductor chip, comprising:
  a substrate;
  an active region in the substrate;
  an interconnecting layer over the active region;
  a plurality of conductive pads, each on the interconnecting layer and surrounded by a dielectric layer; and
  a plurality of conductive bumps, each over corresponding conductive pad, at least one of the conductive bumps proximity to an edge of the semiconductor chip being in contact with at least two discrete regions of the corresponding conductive pad; and a package substrate having a concave surface facing the semiconductor chip and joining the semiconductor chip through the plurality of conductive bumps.

12. The semiconductor package of claim 11, wherein one of the at least two discrete regions closer to a center of the semiconductor chip is larger than another one of the at least two discrete regions closer to the edge of the semiconductor chip.

13. The semiconductor package of claim 11, wherein each of the conductive pads has an oval or elliptical shape from top view perspective.

14. The semiconductor package of claim 13, wherein the at least two discrete regions are on a major axis of each of the conductive pads from top view perspective.

15. The semiconductor package of claim 11, further comprising an under bump metallurgy (UBM) layer between each of the conductive bumps and the at least two discrete regions of the corresponding conductive pad.

16. The semiconductor package of claim 15, wherein each of the conductive bumps comprises at least two protrusions and a pillar on the protrusions.

17. The semiconductor package of claim 16, wherein the at least two protrusions comprise copper and the pillar comprises nickel, and the amounts of copper are less than the amounts of nickel in each of the conductive bumps.

18. The semiconductor package of claim 15, wherein a top surface of the UBM layer and a top surface of each of the protrusions are coplanar to a bottom surface of the pillar.

\* \* \* \* \*